United States Patent [19]

Wilson

[11] 4,363,927
[45] Dec. 14, 1982

[54] THERMOELECTRIC GENERATOR PANEL AND HEATER DEVICE THEREFOR

[76] Inventor: Kenneth T. Wilson, P.O. Box 267, Ocala, Fla. 32670

[21] Appl. No.: 275,753

[22] Filed: Jun. 22, 1981

Related U.S. Application Data

[63] Continuation-in-part of Ser. No. 117,342, Feb. 15, 1980, Pat. No. 4,276,441.

[51] Int. Cl.³ .................... H01L 35/00; H01L 35/28
[52] U.S. Cl. .................................. 136/206; 29/573; 136/212; 136/225; 136/227; 136/236 R; 136/241
[58] Field of Search ................. 29/573; 136/206, 212, 136/225, 227, 236 R, 241

[56] References Cited

U.S. PATENT DOCUMENTS

| | | | |
|---|---|---|---|
| 3,071,495 | 1/1963 | Hanlein | 136/212 |
| 3,284,245 | 11/1966 | Nottage et al. | 136/212 |
| 3,981,751 | 9/1976 | Dasheusky et al. | 136/212 |
| 4,004,948 | 1/1977 | Smith | 136/241 |
| 4,098,617 | 7/1978 | Lidorenko et al. | 136/225 |
| 4,111,717 | 9/1978 | Baxter | 136/225 |
| 4,125,122 | 11/1978 | Stachurski | 136/210 |

*Primary Examiner*—Leland A. Sebstian
*Attorney, Agent, or Firm*—Alfred E. Wilson

[57] ABSTRACT

A thermoelectric generator panel and heater device is disclosed. A heater element is disposed along the normally cool side of a solar panel, comprised of a substantial plurality of substrate strips carrying a plurality of thermocouples, printed in series, and in metallic inks, along one side of the respective strips. Terminal tabs are provided on opposed ends of each strip of thermocouples which are electrically interconnected, in parallel, and a voltage regulator, connected between the panel strips and a heater device, monitors the voltage to maintain a predetermined voltage, 12 volts for example.

6 Claims, 6 Drawing Figures

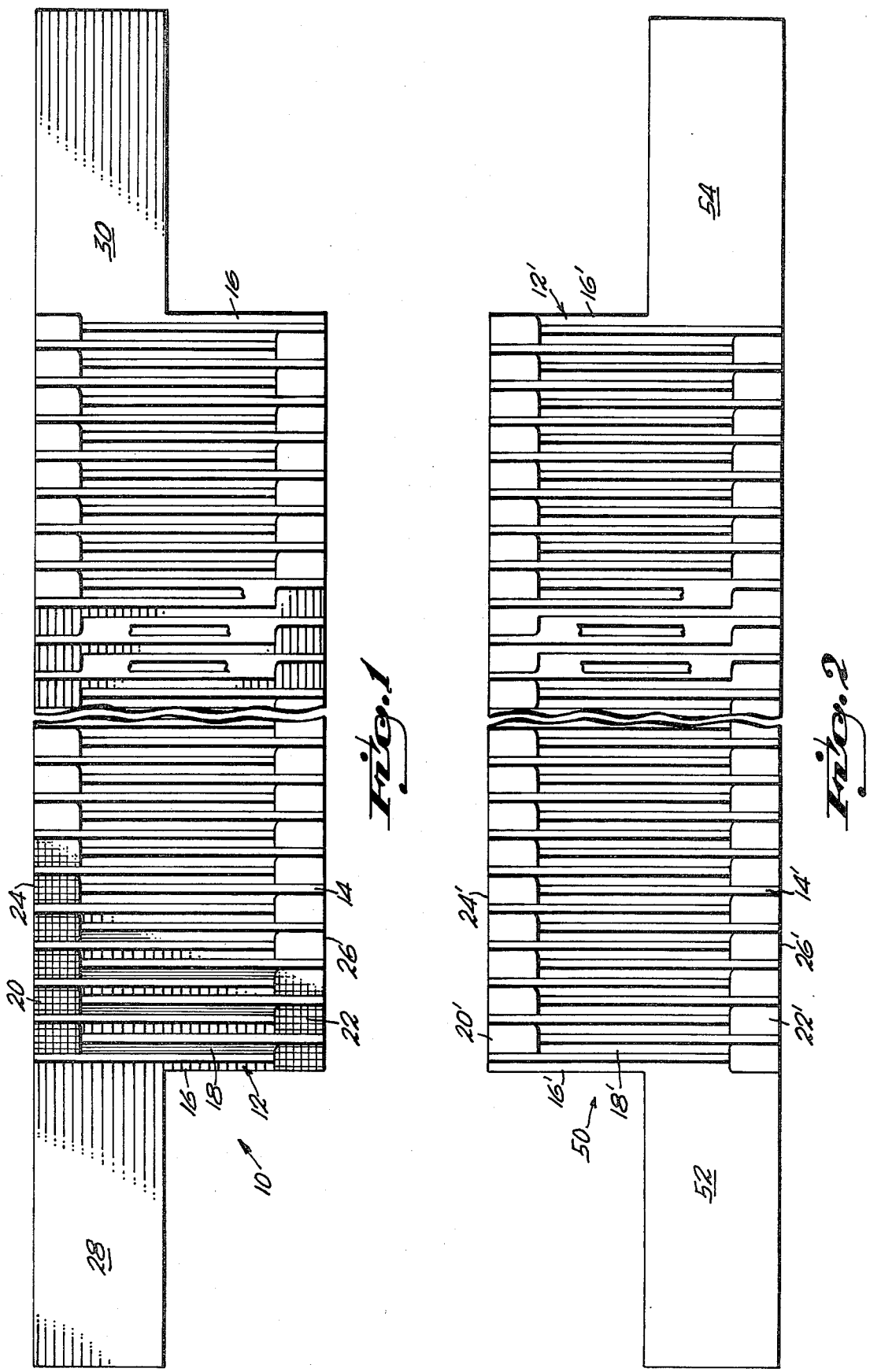

THERMOELECTRIC GENERATOR PANEL AND HEATER DEVICE THEREFOR

This is a continuation-in-part of my copending application Ser. No. 117,342 filed Feb. 15, 1980 now U.S. Pat. No. 4,276,441.

BACKGROUND OF THE PRESENT INVENTION

The present invention pertains to a thermoelectric generator, and more particularly to a thermoelectric generator comprised of a plurality of thermocouples, printed in series in metallic inks, respectively along the length of each of a plurality of substrate strips which are placed in a face-to-back relation, and are connected in parallel to define a panel. A first or hot side of the panel is glazed with a suitable sealant, such as Dow-Corning Silicone material.

A second or cool side of the panel is provided with a series of electric heat strips or a resistance wire, configurated to substantially cover the second, cool side of the panel. The second side is then glazed in the same manner as the first side.

When the first surface of the panel is exposed to direct sunlight, it becomes hot. The second surface, which is away from the sun, is cooler, and therefore an effective e.m.f. is produced. The voltage relative to the amperage is a function of the series parallel connections of the thermocouples and substrate strips.

When a predetermined voltage is produced, a simple voltage controller is used to feed a portion of the produced electrical power to the heating element on the second side. Only the electrical energy in excess of a predetermined voltage, 12 volts, for example, is fed back to the heater element, which raises the temperature of second side thermocouple junctions, thereby limiting the voltage being produced. If the surface temperature of the first side drops, then the electrical energy delivered to the second side also drops, thereby maintaining a constant voltage.

Therefore, the principal object of the invention is to provide means to heat the normally cool side of a thermoelectric generator panel when the voltage reaches a predetermined level, such as 12 volts, to maintain a constant 12 volt output level.

BRIEF DESCRIPTION OF THE DRAWINGS

FIG. 1 is a fragmentary, enlarged elevational view of a first thermocouple strip of the heated thermoelectric generator panel of the present invention;

FIG. 2 is a similar elevational view of a second thermocouple strip;

DESCRIPTION OF A PREFERRED FORM OF THE INVENTION

Figure 3:
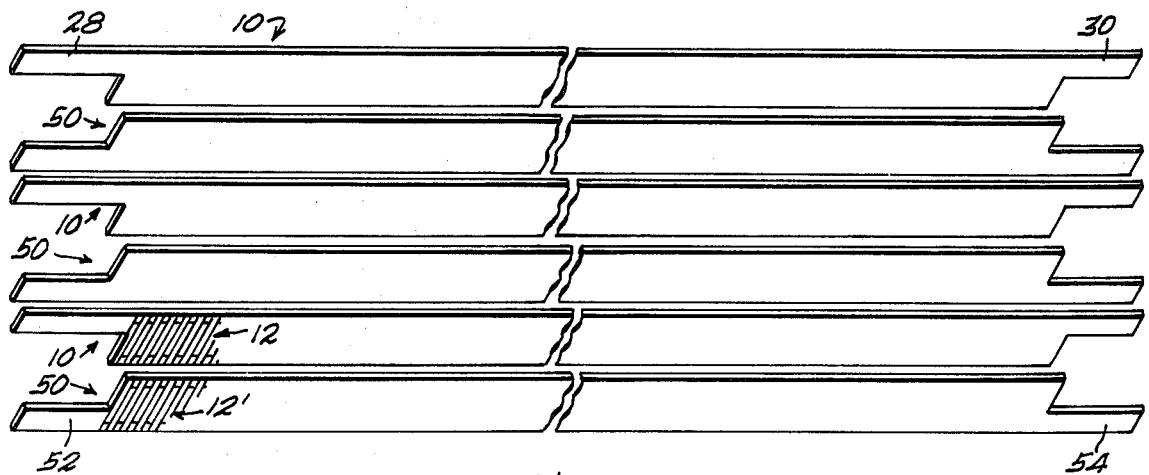
FIG. 3 is an isometric view of a plurality of alternating first and second strips in an exploded relation.

With reference to the drawings, and particulary to FIG. 1, a thermocouple generator strip, indicated generally at 10, includes a plurality of thermocouples 12, disposed in series along an appropriate substrate strip 14, generally defining a pulsed square wave form. The thermocouples are formed of vertically spaced apart legs, such as 16 and 18, with oppositely projecting top and bottom couples 20, 22 connecting between pairs of legs 16, 18 in a manner so as to produce the pulsed square wave form. The thermocouple design 12 is printed on the substrate strips, utilizing a first particulated metal, such as copper, mixed with a suitable binder or flux, and printed on the substrate to define the first legs 16, and the constantan, or second particulated metal, is printed on the strip 14 to define the second legs 18 and the couples 20, 22. The couples 20 define the normally hot edge 24, and couples 22 the normally coller lower edge 26. The strip 14 is then subjected to a suitable heat source to melt the particulated metals into solid masses, causing an intermingling of the overlying copper and constantan in the couples 20 and 22.

A pair of terminal tabs 28, 30 coated with the first metal, such as copper, electrically connects to end first legs 16, and extend outwardly from opposed upper side edge portions of strip 14.

With reference to FIG. 2, a second substrate strip, designated at 50, is identical with strip 10, and all reference numerals are the same with prime designations, with the exception of the end terminal tabs 52, 54 which extend outwardly from opposed lower side edge portions of strip 50, and are simulary coated with the first particulated metal, such as copper, and electrically connect to first legs 16'. It should be noted that the terminal tabs 28, 30 of first strips 10, and 52, 54 of second strips 50, extend respectively down from the top edge of strips 10, and up from the bottom edges of strips 50 for distences of less than one-half the heights thereof to define a space 56 therebetween, FIG. 4.

Figure 4:
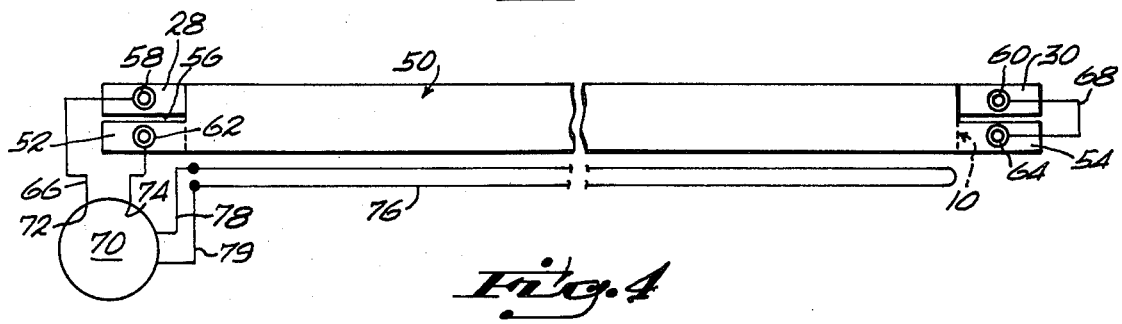
FIG. 4 is an end elevational view of a plurality of alternating first and second strips, electrically interconnected, and including a voltage regulator, electrically connected between a resistance heating element and the alternating strips.
Figure 5:
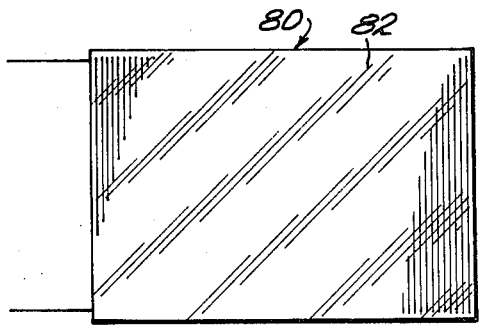
FIG. 5 is a face view of a first side of a panel formed by an alternating face-to-back plurality of the first and second strips.

To enhance the temperature differential between the opposed end couples, the strips 10 and 50 are alternated as illustrated in FIGS. 3 and 4. Very substantial numbers of each strip 10 and 50 are stacked together in a face-to-back relation to define a panel as indicated at 80 in FIG. 5.

All of the strips 10 are electrically interconnected in parallel as at 58, 60 in FIG. 4, through the terminal tabs 28, 30, and the strips 50 are simulary interconnected at 62, 64 through the terminal tabs 52, 54.

Figure 6:
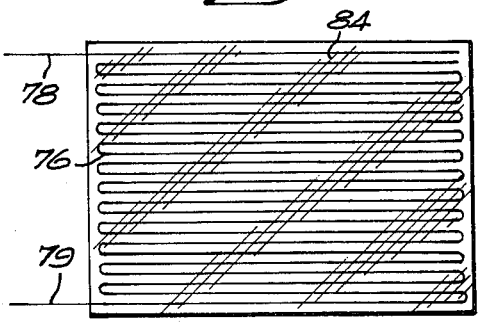
FIG. 6 is a face view of a second side of the panel of FIG. 5.

A simple voltage regulator 70 is connected at 72, 74 in lead 66, and a heating element 76, FIGS. 4 and 6 is electrically connected to the regulator 70 which monitors the electrical energy to maintain a predetermined voltage, 12 volts for example. Excessive electrical energy is circulated by leads 78, 79, through the heating element 76 to raise the temperature of the normally cool bottom couples 22, 22', thereby limiting the voltage being produced to a predetermined level. The panels 80 are glazed on their first and second sides as at 82, 84, FIGS. 5 and 6 to both increase the efficiency of the panels and for protective purposes.

While a preferred form of the instant invention has been herein disclosed, it will be obvious to those skilled in the art, that various changes and modifications can be made therein without departing from the true spirit of the invention as defined in the appended claims.

I claim:

1. A thermoelectric generator device comprising a panel composed of first and second pluralities of thermocouples, defined in respective series on alternating pluralities of substrate strips, said strips being disposed in a face-to-back relationship and including a parallel electrical connection means between said first and second pluralities; said panel including a first relatively hot side and a second relatively cool side as defined by the normal function of said thermocouples, and electric heater means fixed relative to said cool side with control means connected between said electrical connection and heater means to maintain a substantially constant voltage output, 12 volts for example, from said panel.

2. The device as defined in claim 1 wherein said heater means comprises a heating element such as a resistance coil, substantially covering said second side.

3. The device as deined in claim 1 wherein said control means comprises a voltage regulator to maintain said constant voltage output by switching excessive voltage to said heater means.

4. The device as defined in claim 1 wherein said first and second sides of said panels are sealed with a suitable synthetic glazing material.

5. The method of forming a thermoelectrical generator to maintain a substantially constant predetermined voltage which comprises the steps of forming a panel having first and second pluralities of thermocouples having hot and cool sides on alternating pluralities of substrate strips disposed in a face-to-back relationship, and including a parallel electrical connection between the first and second pluralities, and electric heater means operably connected to the cool side of the panel to heat the cool side to maintain a substantially constant output.

6. The method of forming a thermoelelectric generator as defined in claim 5 wherein said substantially constant voltage output is maintained by switching periodic excessive voltages to the heater means.

* * * * *